(12) United States Patent
Park et al.

(10) Patent No.: US 12,342,451 B2
(45) Date of Patent: Jun. 24, 2025

(54) ELECTRONIC COMPONENT MODULE AND POWER SUPPLY DEVICE COMPRISING SAME

(71) Applicant: LG INNOTEK CO., LTD., Seoul (KR)

(72) Inventors: Sung June Park, Seoul (KR); Soo San Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 210 days.

(21) Appl. No.: 18/265,786

(22) PCT Filed: Dec. 14, 2021

(86) PCT No.: PCT/KR2021/019004
§ 371 (c)(1),
(2) Date: Jun. 7, 2023

(87) PCT Pub. No.: WO2022/131767
PCT Pub. Date: Jun. 23, 2022

(65) Prior Publication Data
US 2024/0130037 A1 Apr. 18, 2024

(30) Foreign Application Priority Data

Dec. 15, 2020 (KR) .......................... 10-2020-0175802

(51) Int. Cl.
*H05K 1/02* (2006.01)
*H05K 1/18* (2006.01)
*H05K 3/36* (2006.01)

(52) U.S. Cl.
CPC ......... *H05K 1/0233* (2013.01); *H05K 1/0242* (2013.01); *H05K 1/184* (2013.01); *H05K 3/366* (2013.01); *H05K 2201/10265* (2013.01); *H05K 2201/10272* (2013.01)

(58) Field of Classification Search
CPC ..... H05K 1/0242; H05K 1/0233; H05K 1/184
See application file for complete search history.

(56) References Cited

FOREIGN PATENT DOCUMENTS

| CN | 102881405 | 10/2015 |
|---|---|---|
| CN | 205142021 | 4/2016 |
| JP | 2017-093145 | 5/2017 |
| KR | 10-2003-0069117 | 8/2003 |
| KR | 10-1675401 | 11/2016 |
| KR | 10-2017-0063034 | 6/2017 |
| KR | 10-2019-0085389 | 7/2019 |

OTHER PUBLICATIONS

International Search Report dated Mar. 21, 2022 issued in Application No. PCT/KR2021/019004.
Extended European Search Report dated Oct. 11, 2024, issued in Application No. 21907071.1.

*Primary Examiner* — Jeremy C Norris
(74) *Attorney, Agent, or Firm* — KED & ASSOCIATES, LLP

(57) ABSTRACT

An electronic component module comprises: a first printed circuit board; an inductor disposed on the first printed circuit board and comprising a core, and a first coil disposed in the core; a metal plate disposed on the inductor, and a busbar disposed on the lower portion of the inductor and coupled to the first printed circuit board, wherein the first coil comprises a first terminal protruding upward from the core, and a second terminal protruding downward from the core, and the first terminal is coupled to the metal plate, and the second terminal is coupled to the busbar.

20 Claims, 7 Drawing Sheets

【FIG.1】
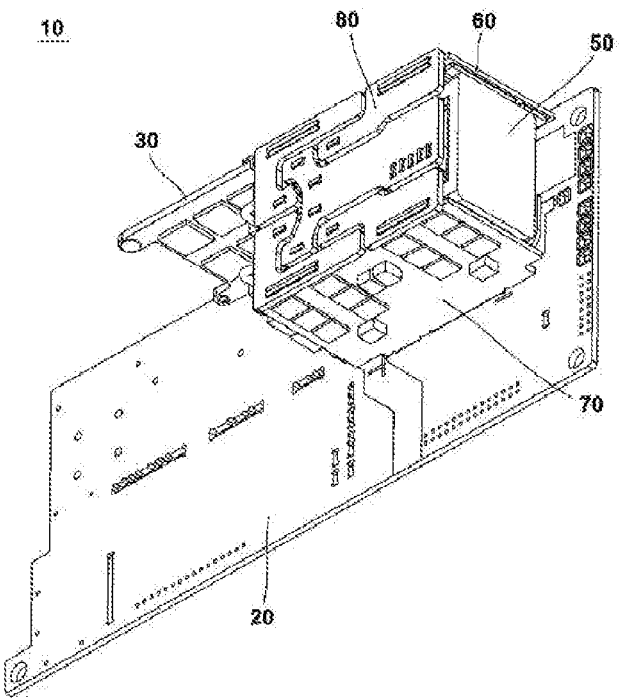
【FIG. 2】
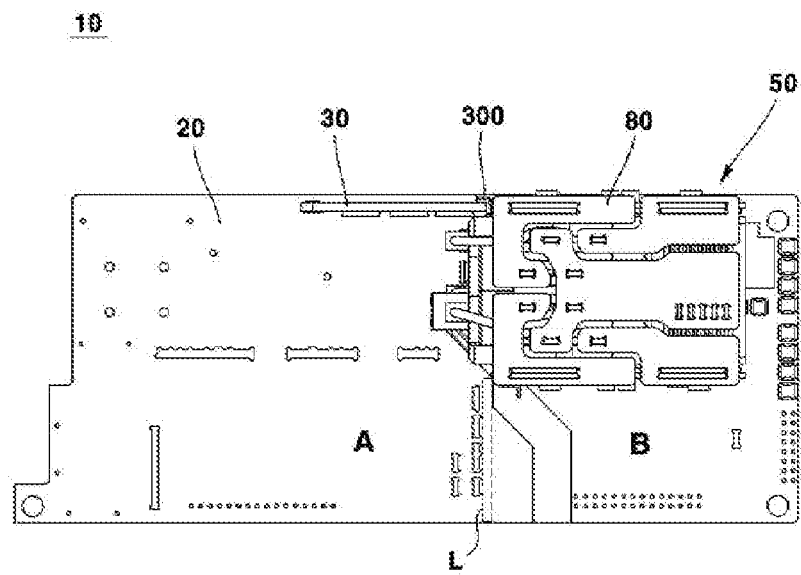

[FIG. 3]
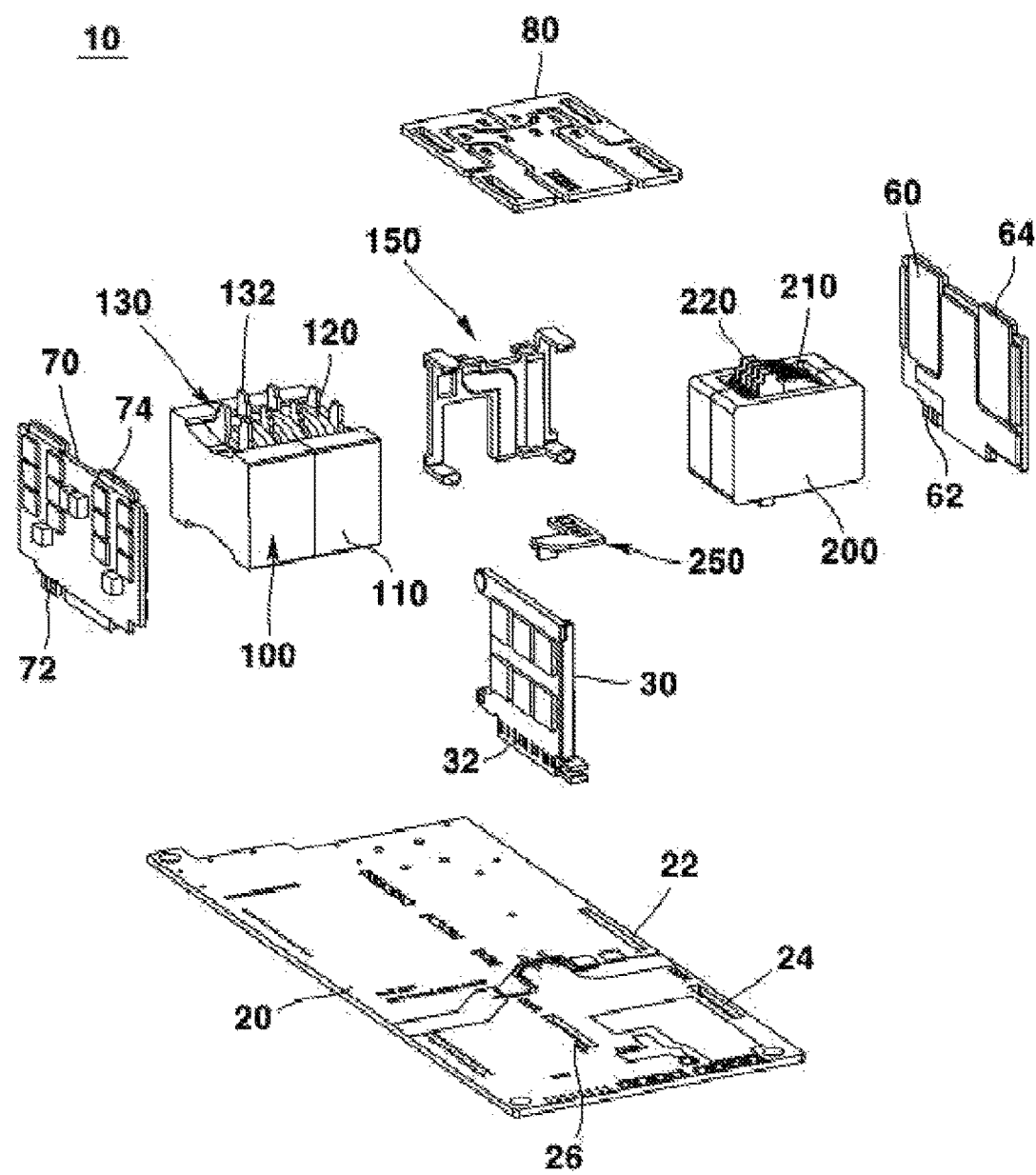

[FIG. 4]
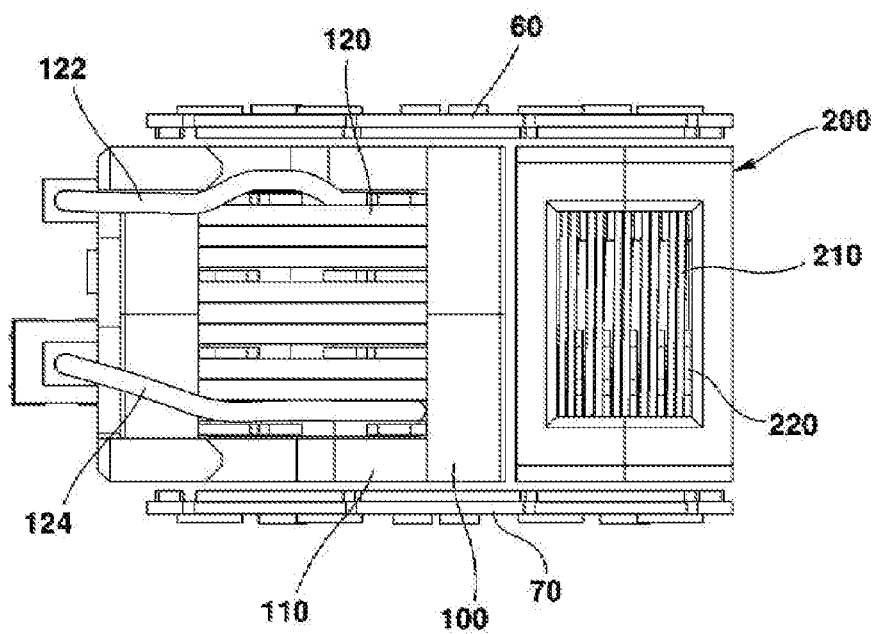
[FIG. 5]
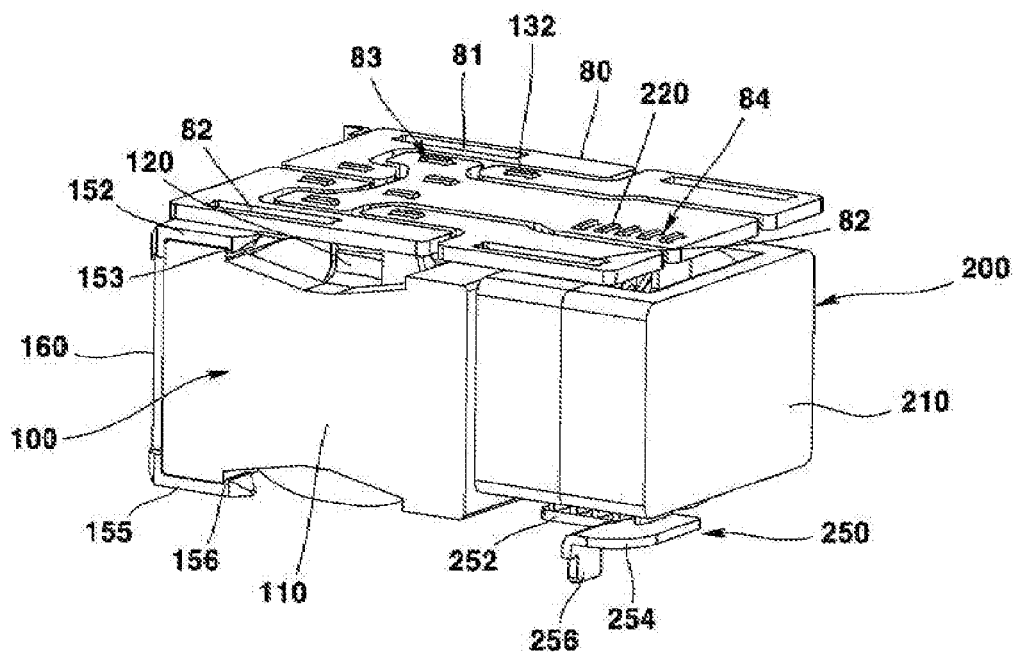

[FIG. 6]
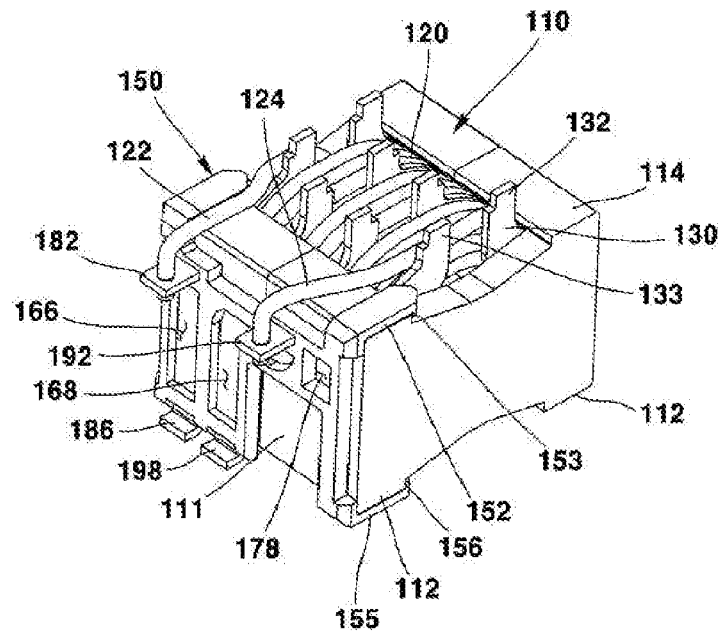
[FIG. 7]
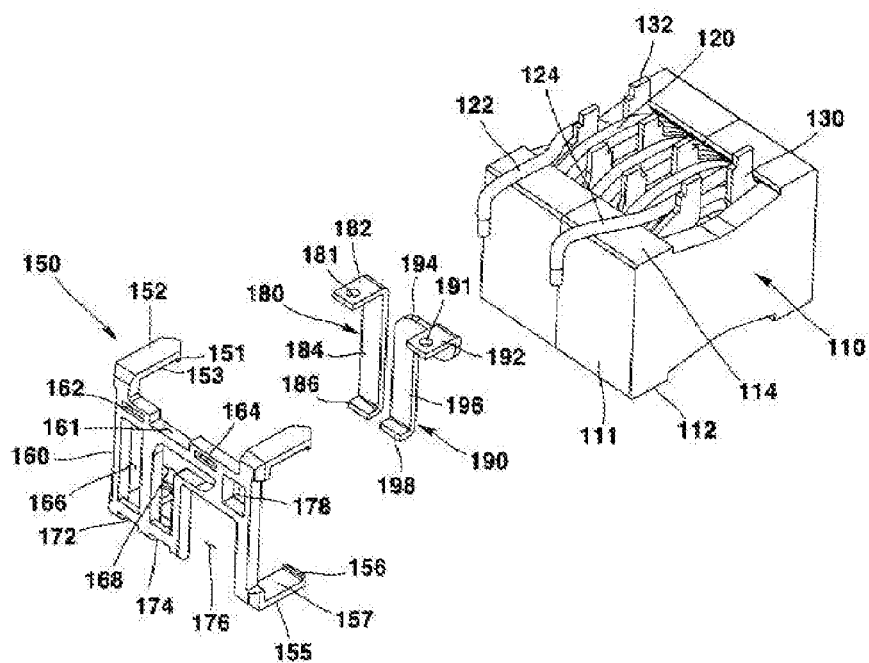

【FIG. 8】
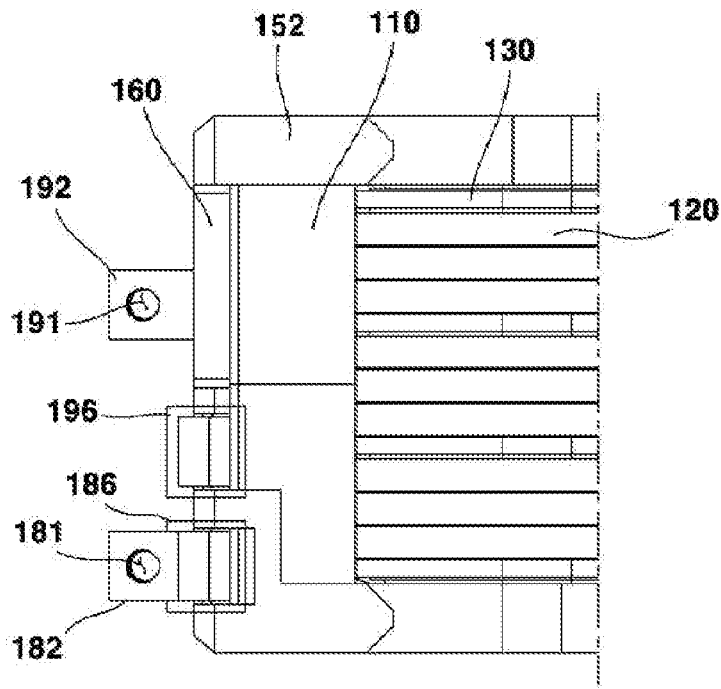
【FIG. 9】
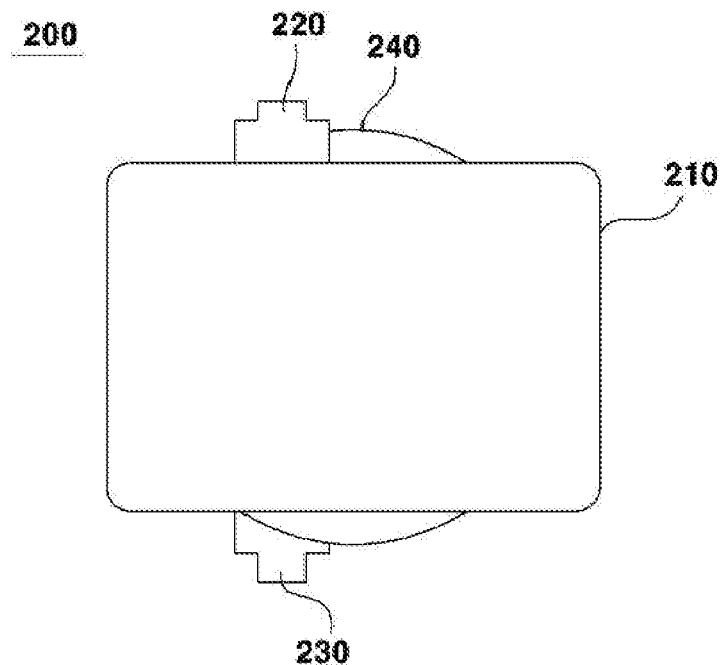

[FIG. 10]
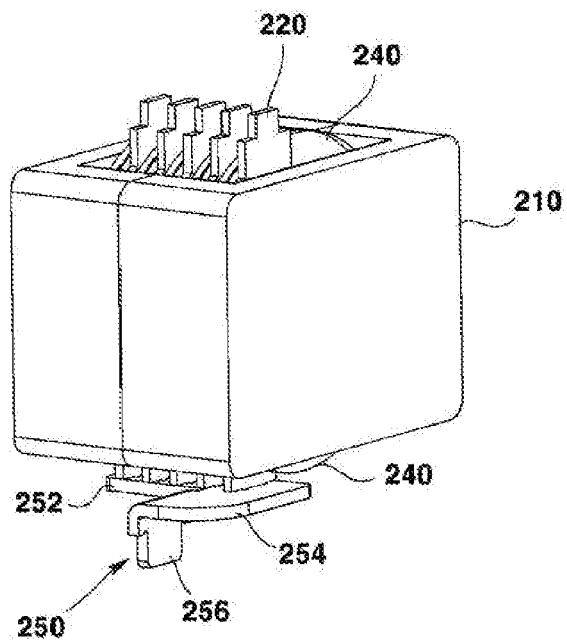
[FIG. 11]
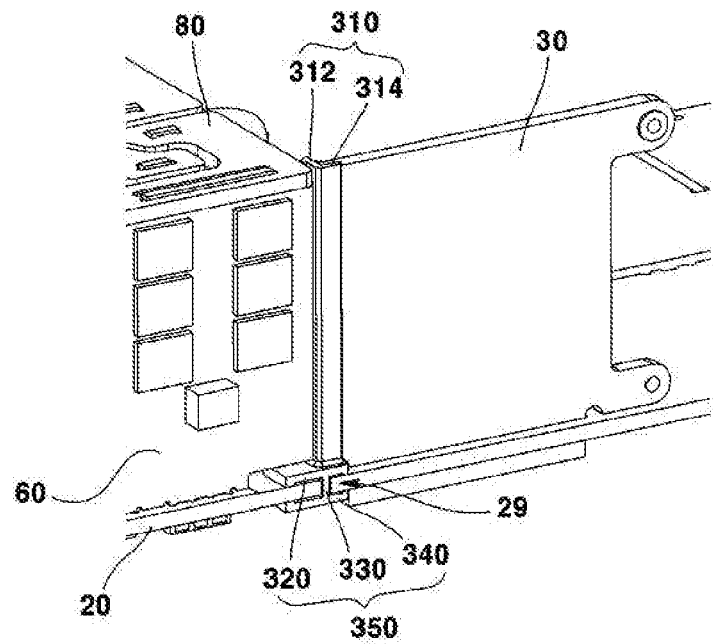

【FIG. 12】
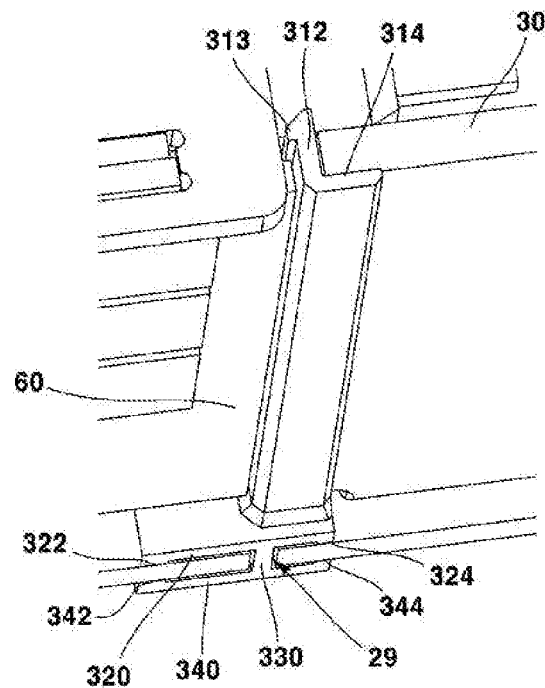
【FIG. 13】
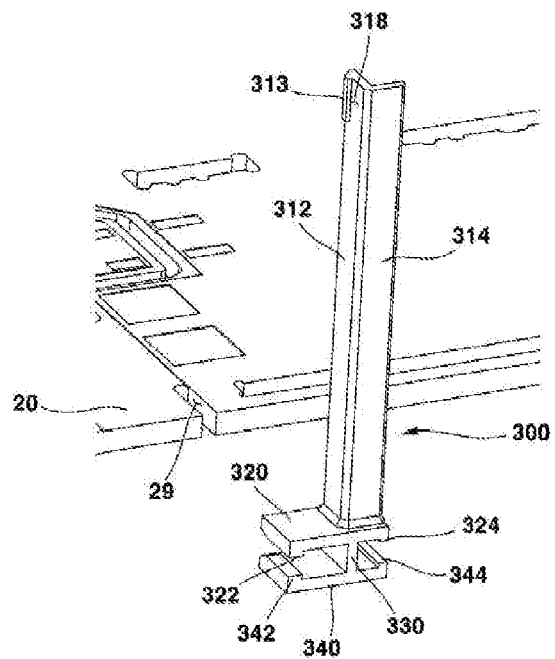

ELECTRONIC COMPONENT MODULE AND POWER SUPPLY DEVICE COMPRISING SAME

CROSS-REFERENCE TO RELATED PATENT APPLICATIONS

This application is a U.S. National Stage Application under 35 U.S.C. § 371 of PCT Application No. PCT/KR2021/019004, filed Dec. 14, 2021, which claims priority to Korean Patent Application No. 10-2020-0175802, filed Dec. 15, 2020, whose entire disclosures are hereby incorporated by reference.

TECHNICAL FIELD

The teachings in accordance with exemplary and non-limiting embodiments of the present invention generally relate to an electronic component module and a power supply device comprising same.

BACKGROUND ART OF THE INVENTION

Modern power electronics technology demands high power and high power density. To achieve the high power, devices with higher power must be selectively configured to increase efficiency and miniaturized with low heat dissipation.

Furthermore, each device must be so arranged as to maximize space efficiency, and at the same time, considerations such as isolation distances and power paths between components must be taken into account, while seismic resistance and cooling performance are also important design factors that must be optimized to achieve high power density.

A power supply device used in an electronic device or data center has an outline formed by a housing, and a plurality of electronic components for driving are disposed within the housing. The electronic components may include a transformer for voltage conversion and an inductor for inductance, and are arranged on a printed circuit board to form a module.

DETAILED DESCRIPTION OF THE INVENTION

Technical Subject

It is a general aspect of the present invention to provide an electronic component module and a power supply device comprising the same that can be miniaturized by improving a fastening structure between components, thereby increasing heat dissipation and power efficiency.

Technical Solution

In one general aspect of the present invention, there may be provided an electronic component module, the module comprising:
a first printed circuit board;
an inductor disposed on the first printed circuit board and comprising a core, and a first coil disposed in the core;
a metal plate disposed on the inductor; and
a busbar disposed on the lower portion of the inductor and coupled to the first printed circuit board, wherein
the first coil comprises a first terminal protruding upward from the core, and a second terminal protruding downward from the core, and the first terminal is coupled to the metal plate, and the second terminal is coupled to the busbar.

Preferably, the metal plate may include a first coupling hole to which the first terminal is coupled.

Preferably, the busbar may include an upper portion including a second coupling hole for the second terminal to be coupled thereto, and a lower portion projecting downwardly from the upper portion to be coupled to the first printed circuit board.

Preferably, the upper portion and the lower portion may be disposed perpendicular to each other.

Preferably, the upper portion may include a first upper end to which the second terminal is coupled, and a second upper end having a region at least partially spaced apart from the first upper end and disposed on an outer side of the core.

Preferably, a transformer may be included that is disposed between the first printed circuit board and the metal plate, and disposed on one side of the inductor, wherein the transformer may include a second core and a second coil disposed within the second core.

Preferably, a winding direction of the first coil may be perpendicular to that of the second coil.

In another general aspect of the present invention, there may be provided a power supply device, the device comprising:
a housing; and
an electronic component module disposed within the housing, wherein the electronic component module comprises:
a first printed circuit board;
an inductor disposed on the first printed circuit board and comprising a core and a first coil disposed within the core;
a metal plate disposed on the inductor; and
a busbar disposed at a lower side of the inductor and coupled to the first printed circuit board, and wherein the first coil includes a first terminal projecting upwardly from the core and a second terminal projecting downwardly from the core, and wherein the first terminal is coupled to the metal plate and the second terminal is coupled to the busbar.

In still another general aspect of the present invention, there may be provided an electronic component module, the module comprising:
a first printed circuit board including a first region and a second region; a metal plate disposed perpendicular to the first printed circuit board on the first region; a transformer and an inductor disposed on the second region; a second printed circuit board disposed perpendicular to the first printed circuit board on the second region; and a supporter interposed between the metal plate and the second printed circuit board, wherein
the supporter includes: a first body disposed at least partially between a side of the metal plate and a side of the second printed circuit board; and a second body disposed at a lower end of the first body and coupled to the first printed circuit board.

Preferably, the first body may include: a first plate interposed between the metal plate and the second printed circuit board; and a second plate disposed on an outer side of the metal plate, wherein the first plate and the second plate may be perpendicularly disposed.

Advantageous Effects

The exemplary embodiments of the present invention have an advantageous effect in that the first coil and the first printed circuit board can be easily coupled via the busbar, and the busbar can be compactly coupled to the outer surface of the transformer via a bracket.

Furthermore, another advantageous effect is that the inductor forms a coupling structure with a plurality of printed circuit boards through a single busbar placed only at the lower side, whereby a broader space can be obtained within the housing.

Furthermore, still another advantageous effect is that, since the busbar disposed in the horizontal direction of the core is omitted, the placement area of the core can be greatly secured, whereby the volume ratio of the coil can be increased within the core.

In addition, still further advantageous effect is that supporters can be used to isolate the plurality of adjacent printed circuit boards from each other, whereby more space for components to be placed on the main printed circuit board can be obtained.

BRIEF DESCRIPTION OF DRAWINGS

FIG. 1 is a perspective view of an electronic component module within a power supply device according to an exemplary embodiment of the present invention.

FIG. 2 is a top view illustrating an upper surface of an electronic component module according to an exemplary embodiment of the present invention.

FIG. 3 is an exploded perspective view of an electronic component module according to an exemplary embodiment of the present invention.

FIG. 4 is a top view illustrating an upper surface of a transformer and an inductor according to an exemplary embodiment of the present invention.

FIG. 5 is a perspective view of an electronic component module excluding a first printed circuit board according to an exemplary embodiment of the present invention.

FIG. 6 is a perspective view of a transformer according to an exemplary embodiment of the present invention.

FIG. 7 is an exploded perspective view of a transformer, a busbar and a bracket according to an exemplary embodiment of the present invention.

FIG. 8 is a top view illustrating a portion of an upper surface of a transformer according to an embodiment of the present invention.

FIG. 9 is a top view illustrating a side surface of an inductor according to an embodiment of the present invention.

FIG. 10 is a perspective view illustrating a coupled state between an inductor and a busbar according to an embodiment of the present invention.

FIG. 11 is a perspective view illustrating a coupled state between a fourth printed circuit board and a fifth printed circuit board on a first printed circuit board according to an embodiment of the present invention.

FIG. 12 is a perspective view of a portion of FIG. 11 seen from an upper side.

FIG. 13 is an exploded perspective view of a first printed circuit board and a support according to an exemplary embodiment of the present invention.

BEST MODE

Hereinafter, exemplary embodiments of the present invention will be described in detail with reference to the following attached drawings.

However, it should be noted that the technical ideas of the present invention should not be construed as limited to some of the explained exemplary embodiments but may be embodied in mutually different various shapes, and one or more elements may be selectively coupled or substituted among exemplary embodiments as long as within the scope of technical concept of the present invention.

Furthermore, unless otherwise defined, all terms (including technical and scientific terms) used herein have the same meanings as commonly understood by one of ordinary skill in the art to which this general inventive concept belongs. It will be further understood that terms, such as those defined in commonly used dictionaries, should be interpreted as having a meaning that is consistent with their meaning in the context of the relevant art and/or the present application.

Furthermore, the terms used in the following exemplary embodiments are not intended to limit the present invention but to explain the exemplary embodiments.

As used herein, the singular forms intended to include the plural forms as well, unless the context clearly indicates otherwise, and when it is described as at least one of "A and (or) B, C (or one or more), it means that one or more combinations of all combinations made of A, B and C may be included.

It will be understood that, although the terms first, second, A, B, (a), (b), etc. may be used herein to describe various elements. These elements should not be limited by these terms and these terms are only used to distinguish one element from another element, and the essence, sequence or order of relevant elements is not limited by the terms.

Furthermore, it will be understood that when an element is referred to as being "connected", "coupled" or "joined" to another element, it can be, directly "connected", "coupled" or "joined" to the other elements or intervening elements may be present.

Furthermore, it will be understood that when an element is referred to as being "upper (above)" or "below (beneath)", the "upper (above)" or "below (beneath)" includes not only two or more elements being directly "connected", "coupled" or "joined" to the other elements but also one or more elements being formed or disposed between two or more elements.

Furthermore, when it is expressed as "beneath" ("below"), or "above" ("upper"), they may be meant to describe not only an upward direction but also a downward direction based on one element.

FIG. 1 is a perspective view of an electronic component module within a power supply device according to an exemplary embodiment of the present invention, FIG. 2 is a top view illustrating an upper surface of an electronic component module according to an exemplary embodiment of the present invention, FIG. 3 is an exploded perspective view of an electronic component module according to an exemplary embodiment of the present invention, FIG. 4 is a top view illustrating an upper surface of a transformer and an inductor according to an exemplary embodiment of the present invention, FIG. 5 is a perspective view of an electronic component module excluding a first printed circuit board according to an exemplary embodiment of the present invention, FIG. 6 is a perspective view of a transformer according to an exemplary embodiment of the present invention, FIG. 7 is an exploded perspective view of a transformer, a busbar and a bracket according to an exemplary embodiment of the present invention, and FIG. 8 is a top view illustrating a portion of an upper surface of a transformer according to an embodiment of the present invention.

Referring to FIGS. 1 to 8, an electronic component module (10) according to an exemplary embodiment of the present invention may be disposed within a power supply device. The power supply device may be shaped by a housing, and the electronic component module (10) may be disposed within the housing. A space may be formed inside the housing for the electronic component module (10) to be disposed.

The electronic component module (10) may include a first printed circuit board (20), a metal plate (80), a second printed circuit board (70), a third printed circuit board (60), a fourth printed circuit board (30), a transformer (100), and an inductor (200), but may be implemented without some of these configurations, or without excluding additional configurations.

The first printed circuit board (20) may be referred to as a main board. The second through fifth printed circuit boards (80, 70, 60, 30) may be referred to as sub-boards. The first printed circuit board (20) forms a base of the electronic component module (10). One or more electronic components for driving the power supply device may be arranged on the first printed circuit board (20).

The metal plate (80), the second printed circuit board (70), the third printed circuit board (60), the fourth printed circuit board (30), the transformer (100), and the inductor (200) may be disposed on the first printed circuit board (20). The first printed circuit board (20) may be electrically connected with the metal plate (80), the second printed circuit board (70), the third printed circuit board (60), the fourth printed circuit board (30), the transformer (100) and the inductor (200).

The first printed circuit board (20) may be arranged with a first hole (26) in which the second printed circuit board (70) is coupled, a second hole (24) in which the third printed circuit board (60) is coupled, and a third hole (22) in which the fourth printed circuit board (30) is coupled. The first hole (26), the second hole (24), and the third hole (22) may be coupled to penetrate a lower surface of the first printed circuit board (20) from an upper surface of the second printed circuit board (70), the third printed circuit board (60), and the fourth printed circuit board (30), corresponding to the disposition areas of the second printed circuit board (70), the third printed circuit board (60), and the fourth printed circuit board (30).

The metal plate (80) may be disposed on an upper surface of the transformer (100) and the inductor (200). The upper surface of the transformer (100) and the inductor (200) may be covered by the metal plate (80). With respect to the transformer (100) and the inductor (200), the first printed circuit board (20) and the metal plate (80) may be disposed oppositely. A cross-sectional area of the metal plate (80) may correspond to an arrangement area of the transformer (100) and the inductor (200).

The metal plate (80) may be formed of a metal material. The metal plate (80) is so arranged as to cover the upper surface of the transformer (100) and the inductor (200), and can dissipate the driving heat of the transformer (100) and the inductor (200). The metal plate (80) is electrically connected with the transformer (100) and the inductor (200), and may also be electrically connected with the first printed circuit board (20) via the second printed circuit board (70) and the third printed circuit board (60).

The metal plate (80) may include a fourth hole (82) and a fifth hole (81). The fourth hole (82) is so disposed as to face upwardly and downwardly with the second printed circuit board (70), and may be so formed as to penetrate a lower surface from an upper surface of the metal plate (80). The fifth hole (81) may be so disposed as to face the third printed circuit board (60) in an upward and downward direction, and may be so formed as to penetrate a lower surface from an upper surface of the metal plate (80).

The second printed circuit board (70) may be so disposed as to cover one side of the transformer (100) and the inductor (200). The second printed circuit board (70) may be disposed perpendicular to the first printed circuit board (20) and the metal plate (80).

The second printed circuit board (70) may be electrically connected with the first printed circuit board (20) and the metal plate (80). A first coupling portion (72) may be disposed to engage the first hole (26) at the bottom of the second printed circuit board (70). The first coupling portion (72) may be formed to protrude downwardly further than the other regions. A second coupling portion (74) may be disposed to engage the fourth hole 82 at the upper end of the second printed circuit board (70).

The second coupling portion (74) may be so formed as to protrude further upwardly than the other regions. In the first coupling portion (72) and the first hole (26), a circuit pattern that electrically connects the first printed circuit board (20) and the second printed circuit board (70) to each other may be formed. In the second coupling portion (74) and the fourth hole (82), a circuit pattern may be formed that electrically connects the metal plate (80) and the second printed circuit board (70) to each other.

The third printed circuit board (60) may be disposed to cover the other side of the transformer (100) and the inductor (200). The other side may be opposite the first side. With respect to the transformer (100) and the inductor (200), the second printed circuit board (70) and the third printed circuit board (60) may be disposed opposite each other. The third printed circuit board (60) may be disposed perpendicular to the first printed circuit board (20) and the metal plate (80).

The third printed circuit board (60) may be disposed parallel to the second printed circuit board (70). The third printed circuit board (60) may be electrically connected with the first printed circuit board (20) and the metal plate (80). At the bottom end of the third printed circuit board (60), a third coupling portion (62) may be disposed to engage the second hole (24).

The third coupling portion (62) may be formed to protrude downwardly from the other regions. On top of the third printed circuit board (60), a fourth coupling portion (64) may be disposed to engage the fifth hole (81).

The fourth coupling portion (64) may be arranged to protrude upwardly above the other regions. In the third coupling portion (62) and second hole (24), a circuit pattern may be formed to electrically connect the first printed circuit board (20) and the third printed circuit board (60) to each other. The fourth coupling portion (64) and fifth hole (81) may be formed with a circuit pattern that electrically connects the metal plate (80) and the third printed circuit board (60) to each other.

The fourth printed circuit board (30) may be disposed on the first printed circuit board (20). The fourth printed circuit board (30) may be disposed perpendicular to the first printed circuit board (20). The fourth printed circuit board (30) may be disposed at an edge of the first printed circuit board (20). The fourth printed circuit board (30) may be disposed at a predetermined distance apart from the third printed circuit board (60). At the bottom end of the fourth printed circuit board (30), a fifth coupling portion (32) may be formed that protrudes downwardly from the other regions.

The fifth coupling portion (32) may be coupled to the third hole (22). A circuit pattern for electrically connecting the fourth printed circuit board (30) and the first printed circuit board (20) may be formed at the fifth coupling portion (32)

and the third hole (22). The coupling structure of the third printed circuit board (60) and the fourth printed circuit board (30) on the first printed circuit board (20) will be described later.

The transformer (100) is for voltage conversion in the power supply device, and may be interposed between the first printed circuit board (20) and the metal plate (80). The transformer (100) may be electrically connected with the first printed circuit board (20) and the metal plate (80). The transformer 100 may have a lower surface facing an upper surface of the first printed circuit board (20) and the upper surface may face a lower surface of the metal plate (80). The transformer (100) may include a core (110), a first coil (120) and a second coil (130).

The core (110) may be a magnetic material. The upper and lower surfaces of the core (110) may be opened. The core (110) may be formed by joining a plurality of segmented cores. For example, the plurality of segmented cores may be mutually coupled in a direction (first direction) facing the second printed circuit board (70) and the third printed circuit board (60). On the inner surface where the plurality of segmented cores may face each other, leg portions (not shown) may be disposed so that the first coil (120) and the second coil (130) are coupled or wound. The segmented cores may be E-shaped cores. The leg portions may be disposed on each of the plurality of split cores so as to have a single axial shape by mutual coupling. The first coil (120) and the second coil (130) may wrap around the leg portion, or may be disposed along a perimeter of the leg portion.

An upper surface and a lower surface of the core (110) may be disposed with protrusions (112, 114) that project more upwardly or downwardly than other regions, respectively. The protrusions (112, 114) may be provided in plurality on the upper surface of the core (110), and may be disposed opposite each other centered on an open region of the top surface of the core (110). The protrusions (112, 114) may be provided in plurality on the lower side of the core (110), and may be disposed opposite each other centered on the lower open area of the core (110). The core (110) may have a side portion (111) to which a bracket (150, to be described later) is coupled. The protrusions (112, 114) may be disposed on upper and lower surfaces of the side portions (111), respectively.

The first coil (120) may be disposed on an inner side of the core (110). The first coil (120) may be wound on the leg portions. The first coil (120) may have a first end (122) forming one end and a second end (124) forming the other end, wherein the first end (122) and the second end (124) may be disposed on an outer side of the core (110). A region between the first end (122) and the second end (124) may be wound on the leg portion. The first coil (120) may be a primary coil.

The second coil (130) may be disposed on an inner side of the core (110). The second coil (130) may be coupled to the leg portion. The second coil (130) may be formed in the shape of a plate. The second coil (130) may be plurally provided and spaced apart from each other. For example, the second coil (130) may comprise four of them and may be spaced apart from each other along the first direction. A placement area of the first coil (120) may be divided by the second coil (130) into a plurality of areas. An upwardly protruding third end (132) and a fourth end (133) may be disposed at both ends of the second coil (130). The third end (132) and the fourth end (133) may be referred to as terminal portions.

The third end portion (132) and the fourth end portion (133) may be coupled to the metal plate (80). A coupling hole (83) may be formed in the metal plate (80) to engage the third end portion (132) and the fourth end portion (133). The third end portion (132) and fourth end portion (133) of the plurality of second coils (130) may be arranged such that at least some of the same are not overlapping in the first direction. The second coil (130) may be a secondary coil.

While the present exemplary embodiment describes the first coil (120) as the primary coil and the second coil (130) as the secondary coil, it is not intended to be limiting, and the second coil (130) may be the primary coil and the first coil (120) may be the secondary coil.

Meanwhile, an insulating sheet (not shown) for insulation may be interposed between a side of the second coil (130) and the first coil (120).

The first coil (120) may be coupled with busbars (180, 190). The busbars (180, 190) may have one end coupled to the first coil (120) and the other end coupled to the first printed circuit board (20). The other end of the busbars (180, 190) may be soldered to the first printed circuit board (20). A lower surface of the other end of the busbars (180, 190) may contact an upper surface of the first printed circuit board (20). Alternatively, a hole (not shown) may be formed in the first printed circuit board (20) for the other end of the busbars (180, 190) to pass therethrough, and the other end of the busbars (180, 190) may be coupled to pass through the hole.

The busbars (180, 190) may be disposed on the side portion (111) of the core (110). The busbars (180, 190) may be arranged to cover at least a portion of the side portion (111). The busbars (180, 190) may be spaced apart from the side portion (111) by a predetermined distance. An insulating sheet or insulating tape for insulation may be interposed between the busbars (180, 190) and the side portion (111).

The busbars (180, 190) may include a first busbar (180) to which the first end portion (122) is coupled, and a second busbar (190) to which the second end portion (124) is coupled. The first busbar (180) may include a first upper end (182), a first lower end (186), and a first connection end (184). The first upper end (182) may be disposed parallel to the first printed circuit board (20) or the metal plate (80). The first upper end (182) may be formed with a first coupling hole (181) to engage the first end portion (122). The first coupling hole (181) may be so formed as to allow penetrating a lower surface from an upper surface of the first upper end (182). The first end portion (122) may be coupled to penetrate the first coupling hole (181). The first end portion (122) may be soldered or fused within the first coupling hole (181). The first lower end (186) may be coupled to the metal plate (80). The first lower end (186) may form a lower end of the first busbar (180). The first lower end (186) may be disposed parallel to the first printed circuit board (20), the metal plate (80), and the first upper end (182). The first lower end (186) may be disposed to overlap the first upper end (182) in an upward and downward direction.

The first connection end (184) may be disposed to connect the first upper end (182) and the first lower end (186). The first connection portion (184) may be disposed perpendicular to the first printed circuit board (20) or the metal plate (80). The first busbar (180) may be formed of a metal material, and the first upper end (182), the first lower end 186, and the first connection portion (184) may be formed integrally.

The second busbar (180) may include a second upper end (192), a second lower end (198), and a second connection portion. The second upper end (192) may be disposed parallel to the first printed circuit board (20) or the metal plate (80). The second upper end (192) may be formed with a second coupling hole (191) to engage the second upper end (124). The second upper coupling hole (191) may be formed to extend downwardly from an upper surface of the second upper end (192). The second upper end (124) may be coupled to penetrate the second coupling hole (191). The second upper end (124) may be soldered or fused within the second coupling hole (191).

The second lower end (198) may be coupled to the metal plate (80). The second lower end (198) may form a lower end of the second busbar (190). The second lower end (198) may be disposed parallel to the first printed circuit board (20), the metal plate (80), and the second upper end (192). The second lower end (198) may be disposed to overlap the second upper end (192) in an upward and downward direction.

The second connection portion may have at least one or more bent region. The second connection portion may include a second-1 connection portion (194) and a second-2 connection portion (196).

The second-1 connection portion (194) may be bent to a horizontal direction from a bottom of the second upper end (192), and its bottom may be connected to an upper end of the second-2 connection portion (196). One end of the second-1 connection portion (194) may be connected to a lower end of second upper end (192) and the other end of the second-1 connection portion (194) may extend to a horizontal direction to be close to the first busbar (180). Accordingly, the both ends (122, 124) of the first coil (120) may be spaced apart by a predetermined distance.

The second-2 connection portion (196) may be disposed to connect the second-1 connection portion (194) and the second lower end (198). The second-2 connection portion (196) may be disposed perpendicular to the first printed circuit board (20) or the metal plate (80). The second-2 connection portion (196) may be disposed perpendicular to the second upper end (192) and the second lower end (198). The second-2 connection portion (196) may be disposed perpendicular to the second-1 connection portion (194). The second-2 connection portion (196) may be spaced apart from the first connection portion (184) by a predetermined distance.

The spacing distance between the first upper end (182) and the second upper end (192) may be formed to be longer than the spacing distance between the first connection portion (184) and the second-2 connection portion (196). This is due to the above-described arrangement structure of the second connection portion (192), such that a sufficient separation distance between the two ends of the first coil (120) can be secured in the coupling area with the first coil (120) through the shape of the busbars (180, 190), and a larger space for placing parts on the metal plate (80) can be secured by having a relatively small placement area on the metal plate (80).

A bracket (150) may be disposed on one side of the transformer 100 to support the busbars (180, 190) on an outer surface of the core (110). By means of the bracket (150), the busbars (180, 190) may be rigidly fixed on the outer side of a side portion (111) of the core (110). The material of the bracket (150) may be formed of plastic. The bracket (150) may include an upper surface portion (152), a lower surface portion (155), and a side surface portion (160).

The upper surface portion (152) may be bent inwardly from an upper end of the side portion (160) to be coupled to the core (110). The upper surface portion (152) may be plurally provided and spaced apart from each other. The upper surface portion (152) and the lower surface portion (155) may be disposed in each of the four corner regions of the side portions (160). The upper surface portion (152) may have a bottom surface contacting an upper surface of the core (110).

A bottom surface of the upper surface portion (152) may contact an upper surface of the protrusion (114). A downwardly projecting rib (151) may be formed on the bottom side of the upper surface portion (152). The rib (151) may be disposed at a lower end of the upper surface portion (152) extending outwardly. A side of the rib (151) may contact a side of the protrusion 114. In other words, the upper surface portion (152) may be hookedly coupled to the core (110) via the rib (151).

The lower surface portion 155 may be bent inwardly from the lower end of the side portion (160) and coupled to the core (110). The lower surface portion (155) may be plurally provided and spaced apart from each other. The lower surface portion (155) may have an upper surface in contact with a lower surface of the core (11). An upper surface of the lower surface portion (155) may be in contact with a bottom surface of the protrusion (112). An upwardly projecting rib (156) may be formed on an upper surface of the lower surface portion (155). The rib (156) may be disposed on an upper surface of the lower surface portion (155) extending outwardly. Sides of the rib (156) may contact sides of the protrusion (112). The lower surface portion (155) may be hookedly coupled to the core (110) through the rib (156). In summary, the upper surface portion (152) and the lower surface portion (155) cover the top and bottom surface of the core (110), and may be hookedly coupled to the protrusions (112, 114).

The side portion (160) may include a first through-hole (162), a second through-hole (164), a third through-hole (166), and a fourth through-hole (168). The first to fourth through-holes (162, 164, 166, 168) may be formed to penetrate an outer surface from an inner surface of the side portion (160).

The first through-hole (162) may be formed in a region facing the first upper end (182), through which the first upper end (182) may penetrate. The first upper end (182) may be partially disposed on the outer side of the bracket (150) through the first through-hole (162). A cross-sectional area of the first through-hole (162) may be formed greater than a cross-sectional area of the first upper end (182). An up-and-down length of the first through-hole (162) may be formed to be longer than an up-and-down thickness of the first upper end (182). Accordingly, a flow space of the first busbar (180) can be sufficiently secured.

The second through-hole (164) may be formed in a region facing the second upper end (192), through which the second upper end (192) may penetrate. The second upper end (192) may penetrate the second through-hole (164) and be partially disposed on the outer side of the bracket (150). A cross-sectional area of the second through-hole (164) may be formed greater than a cross-sectional area of the second upper end (192). An up-and-down length of the second through-hole 164 may be formed to be longer than an up-and-down thickness of the second upper end (192). Accordingly, a flow space of the second busbar (190) can be sufficiently secured. A first spacing groove (161) may be disposed between a formed region of the first through-hole (162) and a formed region of the second through-hole (164) in an upper end of the side portion (160).

The third through-hole (166) may be formed in a region facing the first connection portion (184), and may expose the first connection portion (184) to the outside. The third through-hole (166) may be disposed below the first through-hole (162). At least a portion of the first connection portion (184) may be exposed to the outside of the bracket (150) through the third through-hole (166).

The fourth through-hole (168) may be formed in a region facing the second connection portion (192) and the second-2 connection portion (196), and may expose the second connection portion (192) and the second-2 connection portion (196) to the outside. The fourth through-hole (168) may be disposed at least partially below the second through-hole (162). At least a portion of the second connection portion (192) and the second-2 connection portion (196) may be exposed to the outside of the bracket (150) through the fourth through-hole (168).

A first guide groove (172) and a second guide groove (174) may be disposed at a bottom of the side portion (160), which are recessed upwardly from the other regions. The first guide groove (172) may be coupled to the first lower end (186). The first lower end (186) may penetrate the first guide groove (172) and project at least partially outwardly of the bracket (150). A first directional length of the first guide groove (172) may correspond to a first directional length of the first lower end (186), or may be formed to be longer.

The second guide groove (174) may be coupled to the second lower end (198). The second lower end (198) may extend through the second guide groove (174) and project at least partially outwardly of the bracket (150). A first directional length of the second guide groove (174) may correspond to, or be longer than, a first directional length of the second lower end (198).

In response to the arrangement structure on the busbars (180, 190), the spacing distance between the first through-hole (162) and the second through-hole (164) may be formed to be longer than the spacing distance between the first guide groove (172) and the second guide groove (174).

The side portion (160) may be formed with at least one or more holes for exposing the sides of the core (110). For example, a first exposure hole (178) and a second exposure hole (176) may be formed in the side portion (160). The second exposure hole (176) may be disposed below the first exposure hole (178). At least a portion of side portion (111) of the core (110) may be exposed to the outside through the first exposure hole (178) and the second exposure hole (176). Accordingly, the heat dissipation efficiency of the transformer (100) may be improved.

According to the above structure, it is advantageous that the first coil and the first printed circuit board can be easily coupled through the busbar, and the busbar can be compactly coupled to the outer surface of the transformer through the bracket.

FIG. 9 is a top view illustrating a side surface of an inductor according to an embodiment of the present invention, and FIG. 10 is a perspective view illustrating a coupled state between an inductor and a busbar according to an embodiment of the present invention.

Referring to FIGS. 3, 5, 9 and 10, the inductor (200) may be disposed on one side of the transformer (100). The inductor (200) is for obtaining an inductance in the power supply device, and may be disposed between the first printed circuit board (20) and the metal plate (80). The inductor (200) may be electrically connected with the first printed circuit board (20) and the metal plate (80).

The inductor 200 may have a lower surface facing an upper surface of the first printed circuit board (20), and an upper surface facing a lower surface of the metal plate (80). The inductor (200) may be disposed a predetermined distance apart from the transformer (100) to the horizontal direction. The inductor (200) may include a core (210) and a coil (240).

The core (210) may have the character of a magnetic circuit and may serve as a passageway for magnetic flux. The core (210) may be formed by coupling a plurality of split cores. Each of the split cores may comprise an E-type or an I-type core. If the split cores are E-shaped cores, they may be arranged in a left-right symmetrical configuration. The core (210) may comprise a magnetic material. Leg portion may be formed on an inner surface of the split core to engage the coils (240). The leg portion may be disposed on each of the plurality of split cores so as to have a single axial shape by mutual coupling. The coils (240) may wrap around the leg portions, or may be disposed along the perimeter of the leg portions.

The coil (240) may be formed of a conductive metal. The coil (240) may be formed in the shape of a wound metal conductor, or may be formed in the shape of a plate. The coil (240) may comprise a plurality of coils and may be spaced apart from each other to a second direction perpendicular to a first direction. An insulating plate for insulation may be interposed between a plurality of coils 240, or an insulating material may be coated on the surface of adjacent coils 240. The winding direction of the coils (240) in the inductor (200) may be perpendicular to the winding direction of a first coil (120) in the transformer (100).

Each coil (240) may include terminals (220, 230) that are electrically connected to the first printed circuit board (20) and the metal plate (80). The terminals (220, 230) may be formed by both ends of the metal conductors. The terminals (220, 230) may include a first terminal (220) projecting upwardly from the core (210) and a second terminal (230) projecting downwardly from the core (210). The first terminal (220) and the second terminal (230) may be disposed perpendicular to the first printed circuit board (20) or the metal plate (80). The first terminal (220) and the second terminal (230) may be disposed symmetrically about the core (210). A coupling hole (84) may be formed on the metal plate (80) to engage the first terminal (220). Accordingly, the coil (240) may be electrically connected with the metal plate (80).

The second terminal (230) may be coupled with a busbar (250). The coil (240) may be electrically connected to the first printed circuit board (20) via the busbar (250). The busbar (250) may include upper portions (252, 254) and a lower portion (256) that is bent downwardly at an end of the upper portions (252, 254). The upper portions (252, 254) and the lower portion (256) may be formed of a metal material and may be formed integrally.

The upper portions (252, 254) may include a first upper portion (252) and a second upper portion (254). The upper portions (252, 254) may have a semi-circular cross-section. The first upper portion (252) and the second upper portion (254) may have regions that are at least partially parallel to each other. The first upper portion (252) and the second upper portion (254) may have horizontally spaced apart regions. At least some of the second upper portion (254) may have regions that do not overlap the core (200) in an upward or downward direction.

The first upper portion (252) may be formed with a coupling hole for the second terminal (230) to be coupled. The coupling hole may be arranged in a plurality corresponding to the number of the coils (240) and second terminals (230). The second terminals (230) may be inserted into the coupling holes. The busbar (250) may be electrically connected with the coils (240) by coupling engagement of the second terminal (230).

The lower portion (256) may be curved downwardly from an end of the second upper portion (254), and may be disposed perpendicular to the upper portions (252, 254). The lower portion (256) may project downwardly from the bottom of the upper portion (252, 254). The lower portion (256) may be coupled to a coupling hole in the first printed circuit board (20). As a result, the busbar (250) may be electrically connected to the first printed circuit board (20).

According to the above structure, the inductor (200) forms a coupling structure with the plurality of printed circuit boards (20, 80) through a single busbar (250) disposed only in the lower part, which has the advantage of securing a large space in the housing. Furthermore, since the busbars disposed in the horizontal direction of the core (210) are omitted, the deployment area of the core (210) can be greatly secured, which has the advantage of increasing the volume ratio of the coils in the core (210).

Furthermore, the length of the busbar for electrical connection can be relatively reduced, which has the advantage of improving power efficiency.

FIG. 11 is a perspective view illustrating a coupled state between a fourth printed circuit board and a fifth printed circuit board on a first printed circuit board according to an embodiment of the present invention, FIG. 12 is a perspective view of a portion of FIG. 11 seen from an upper side, and FIG. 13 is an exploded perspective view of a first printed circuit board and a support according to an exemplary embodiment of the present invention.

Referring to FIGS. 1, 2, 3, 11, 12 and 13, the electronic component module (10) may have a plurality of regions with different functions. For example, the first printed circuit board (20) may include a first region (A) having a first function and a second region (B) having a second function. Electronic components for the first function may be disposed in the first region (A), and electronic components for the second function {e.g., transformer (100) and inductor (200)} may be disposed in the second region (B).

The first function and the second function are electrical and circuital functions, for example, the electronic component module (10) can convert a voltage of a first magnitude transmitted in the first region (A) into a voltage of a second magnitude in the second region (B), or convert a voltage of a second magnitude transmitted in the second region (B) into a voltage of a first magnitude in the first region (A). Thus, the fourth printed circuit board (30) disposed in the first region (A) may be operated in the first function, and the third printed circuit board (60) disposed in the second region (B) may be operated in the second function.

Thus, the fourth printed circuit board (30) disposed in the first region (A) may be operated as a first function, and the third printed circuit board (60) disposed in the second region (B) may be operated as a second function.

Based on FIG. 2, the first region (A) and the second region (B) may be separated by an imaginary line (L). In order to prevent noise generation between the first region (A) and the second region (B) due to their different electrical functions, a shield (not shown) may be disposed on the imaginary line (L). The shield may be formed in the shape of a metal plate, and may mutually compartmentalize the first region (A) and the second region (B). The shield may be disposed perpendicular to the first printed circuit board (20).

To mutually isolate the third printed circuit board (60) and the fourth printed circuit board (30), which are coupled to or disposed adjacent to the shield, the electronic component module may include a supporter (300). The supporter (300) may be coupled to the first printed circuit board (20) and disposed between the third printed circuit board (60) and the fourth printed circuit board (30). The supporter (300) may be formed of a plastic or resinous material.

To be more specific, the supporter (300) may include a first body (310) and a second body (350).

The first body (310) may be interposed between the third printed circuit board (60) and the fourth printed circuit board (30). The first body (310) may be formed such that its upper and lower lengths correspond to, or are extended beyond, the vertical directional lengths of the third printed circuit board (60) or the fourth printed circuit board (30). The first body (310) may be formed to protrude upwardly from an upper surface of the second body (350). The first body (310) may have a bar shape. The first body (310) may have an approximate " ∟ " shape in cross-section.

The first body (310) may include a first plate portion (312) and a second plate portion (314). The first plate portion (312) and the second plate portion (314) may be disposed perpendicular to each other. The first plate portion (312) may be disposed with one side facing a side of the third printed circuit board (60) and the other side facing a side of the fourth printed circuit board (30). The two sides of the first plate portion (312) may be disposed in contact with, or spaced apart from, a side of the third printed circuit board (60) and a side of the fourth printed circuit board (30), respectively.

An outwardly projecting guide rib (313) may be formed on one side of the first plate portion (312) facing the third printed circuit board (60). The guide rib (313) may be disposed adjacent to an upper end of the first plate portion (312). An outer surface of the guide rib (313) may be disposed to face an inner surface of the third printed circuit board (60). The outer surface of the guide rib (313) may be in contact with the inner surface of the third printed circuit board (60).

A guide groove (318) may be formed by the guide rib (313) on an inner side of the guide rib (313) into which the sides of the third printed circuit board (60) engage. Accordingly, the inner and outer surface of the third printed circuit board (60) may be supported by an inner surface of the housing and by the guide ribs (313).

The second plate portion (314) may be disposed on an outer side of the first plate portion (312), and may support an outer surface of the fourth printed circuit board (30). It can also be understood that the second plate portion (314) protrudes from the other side of the first plate portion (312) facing the fourth printed circuit board (30). The second plate portion (314) may contact an outer surface of the fourth printed circuit board (30). The outer surface of the fourth printed circuit board (30) may be supported by the inner surface of the second plate (314), and the side of the fourth printed circuit board (30) may be supported by the other side of the first plate (312). The protruding length of the first plate (312) from the inner surface of the second plate (314) may be formed to be longer than the thickness of the third printed circuit board (60) or the fourth printed circuit board (30).

The second body (350) may be disposed at a lower surface of the first body (310). The second body (350) may form a lower end of the supporter (300). The second body (350) may be coupled to the first printed circuit board (20). The first printed circuit board (20) may include a coupling groove (29) in which a side portion is incised inwardly, for being coupled with the second body (350). The coupling groove (29) may be disposed to overlap with the imaginary line (L) and some of the disposition areas of the shield. The coupling groove (29) may be in the shape of a hole extending downwardly from an upper surface of the first printed circuit board (20).

The second body (350) may include an upper plate (320), a lower plate (340), and a side plate (330). The upper plate (320) may be disposed on the first printed circuit board (20). An upper surface of the upper plate (320) may support a bottom surface of the first body (310). A portion of the upper surface of the upper plate (320) may contact a bottom surface of the third printed circuit board (60). The coupling groove (29) may be formed such that a length of the second body (350) disposed in the second region (B) is longer than a length of the second body (350) disposed in the first region (A), relative to the side plate (330).

A lower surface of the upper plate (320) may be disposed with downwardly projecting first ribs (322, 324). The first ribs (322, 324) may contact an upper surface of the first printed circuit board (20). Through the first ribs (322, 324), some of the lower surfaces of the upper plate (320) may be spaced a predetermined distance from the upper surface of the first printed circuit board (20). The plurality of first ribs (322, 324) may be disposed on both edges of the lower surface of the upper plate (320).

The lower plate (340) may be disposed on a lower portion of the first printed circuit board (20). An upper surface of the lower plate (340) may be disposed facing a lower surface of the first printed circuit board (20). The lower plate (340) may be disposed opposite the upper plate (320).

Upwardly projecting second ribs (342, 344) may be disposed on an upper surface of the lower plate (340). The upper surface of the second ribs (342, 344) may contact a lower surface of the first printed circuit board (20). Through the second ribs (342, 344), a portion of the upper surface of the lower plate (340) may be spaced a predetermined distance from the lower surface of the first printed circuit board (20). The plurality of second ribs (342, 344) may be disposed on both edges of the upper surface of the lower plate (340). The second ribs (342, 344) of the lower plate (340) and the first ribs (322, 324) of the upper plate (320) may be disposed symmetrically with respect to each other.

The vertical spacing distance between the first ribs (322, 324) and the second ribs (342, 344) may correspond to the vertical thickness of the first printed circuit board (20).

The side plate (330) may be disposed to connect the upper plate (320) and the lower plate (340). The side plate (330) may be disposed perpendicular to the upper plate (320) and the lower plate (340). The side plate (330) may be disposed to penetrate the coupling groove (29). A vertical length of the side plate (330) may be formed longer than a vertical thickness of the first printed circuit board (20). A side surface of the first printed circuit board (20) and an outer surface of the side plate (330) may form a same plane. By slide movement of the side plate (330) in the coupling groove (29), the second body (350) may be coupled to the first printed circuit board (20). To facilitate the slide movement, at least some of the upper surfaces of the ribs (322, 324, 342, 344) of the upper plate (320) and the lower plate (340) may be formed with slopes having a different height from that of other areas.

According to the above structure, it is possible to isolate a plurality of printed circuit boards disposed adjacent to each other by means of the supporters, which has the advantage of securing a larger space for placing components on the main printed circuit board.

While all of the components comprising embodiments of the present invention have been described above as combining or operating in combination, the present invention is not necessarily limited to these embodiments, i.e., all of the components may optionally operate in combination with one or more of the components within the scope of the present invention.

Furthermore, it should be interpreted that terms such as "comprising," "including," and "having," thus given are inclusive and therefore specify the presence of stated elements, but do not preclude the presence or addition of one or more other elements unless otherwise specified. All terms, including technical or scientific terms, shall, unless otherwise defined, have the same meaning as commonly understood by one of ordinary skill in the art to which this invention belongs. Commonly used terms, such as dictionary-defined terms, are to be interpreted as consistent with their contextual meaning in the relevant art and are not to be construed in an idealized or overly formal sense unless expressly defined by the present invention.

The aforementioned explanations are simply exemplary of the technical ideas of the present invention, and it should be understood by those skilled in the art that the present invention can be implemented in other various variations and modifications without changes of technical ideas or essential characteristics. Thus, it should be understood that the exemplary embodiments disclosed in the present invention must be considered not in a limited aspect but in an explanatory aspect. It should be also interpreted that the protective scope of the present invention is not shown in the aforementioned explanation but in the claims, and all technical ideas within the equivalents thereof shall be included within the scope of the present invention.

The invention claimed is:

1. An electronic component module, the module comprising:
    a first printed circuit board;
    an inductor disposed on the first printed circuit board and comprising a core, and a first coil disposed in the core;
    a metal plate disposed on the inductor; and
    a busbar disposed on the lower portion of the inductor and coupled to the first printed circuit board, wherein
    the first coil comprises a first terminal protruding upward from the core, and a second terminal protruding downward from the core, and the first terminal is coupled to the metal plate, and the second terminal is coupled to the busbar.

2. The electronic component module of claim 1, wherein the metal plate includes a first coupling hole to which the first terminal is coupled.

3. The electronic component module of claim 1, wherein the busbar includes an upper portion including a second coupling hole for the second terminal to be coupled thereto, and a lower portion projecting downwardly from the upper portion to be coupled to the first printed circuit board.

4. The electronic component module of claim 3, wherein the upper portion and the lower portion are disposed perpendicular to each other.

5. The electronic component module of claim 3, wherein the upper portion includes a first upper end to which the second terminal is coupled, and a second upper end having a region at least partially spaced apart from the first upper end and disposed on an outer side of the core.

6. The electronic component module of claim 1, wherein a transformer is included that is disposed between the first printed circuit board and the metal plate, and disposed on one side of the inductor, wherein the transformer includes a second core and a second coil disposed within the second core.

7. The electronic component module of claim 6, wherein a winding direction of the first coil is perpendicular to that of the second coil.

8. The electronic component module of claim 6, wherein the second coil includes a primary coil and a secondary coil, wherein the primary coil includes a first end and a second end, and wherein the first end and the second end are connected to the first printed circuit board.

9. The electronic component module of claim 8, wherein the secondary coil is connected to the metal plate.

10. The electronic component module of claim 8, wherein the primary coil and the secondary coil are alternately disposed within the second core.

11. The electronic component module of claim 8, comprising a first bus bar connecting one end of the primary coil and the first printed circuit board, and a second bus bar connecting an other end of the primary coil and the first printed circuit board.

12. The electronic component module of claim 11, comprising a bracket disposed on an outer surface of the second core and supporting the first bus bar and the second bus bar.

13. The electronic component module of claim 12, wherein the bracket is hook-coupled to the second core.

14. The electronic component module of claim 1, comprising a second printed circuit board disposed to cover one side of the inductor and a third printed circuit board disposed to cover an other side of the inductor, wherein the second printed circuit board and the third printed circuit board are disposed perpendicular to the first printed circuit board.

15. A power supply device, the device comprising:
a housing; and
an electronic component module disposed within the housing, wherein the electronic component module comprises:
a first printed circuit board;
an inductor disposed on the first printed circuit board and comprising a core and a first coil disposed within the core;
a metal plate disposed on the inductor; and
a busbar disposed at a lower side of the inductor and coupled to the first printed circuit board, and wherein
the first coil includes a first terminal projecting upwardly from the core and a second terminal projecting downwardly from the core, and wherein the first terminal is coupled to the metal plate and the second terminal is coupled to the busbar.

16. The electronic component module, the module comprising:
a first printed circuit board including a first region and a second region;
a metal plate disposed perpendicular to the first printed circuit board on the first region;
a transformer and an inductor disposed on the second region; a second printed circuit board disposed perpendicular to the first printed circuit board on the second region; and
a supporter interposed between the metal plate and the second printed circuit board, wherein
the supporter includes:
a first body disposed at least partially between a side of the metal plate and a side of the second printed circuit board; and
a second body disposed at a lower end of the first body and coupled to the first printed circuit board.

17. The electronic component module of claim 16, wherein the first body includes: a first plate interposed between the metal plate and the second printed circuit board; and a second plate disposed on an outer side of the metal plate, wherein the first plate and the second plate may be perpendicularly disposed.

18. The electronic component module of claim 17, wherein a guide rib protrudes outward from one side surface of the first plate facing the second printed circuit board and has an outer surface facing an inner surface of the second printed circuit board.

19. The electronic component module of claim 16, wherein the first printed circuit board includes a coupling groove disposed between the first region and the second region,
wherein the second body include:
a top plate disposed on an upper surface of the first printed circuit board;
a lower plate disposed on a lower surface of the first printed circuit board; and
a side plate connecting the top plate and the lower plate and disposed in the coupling groove.

20. The electronic component module of claim 19, wherein a first rib contacting an upper surface of the first printed circuit board is disposed on a lower surface of the top plate,
wherein a second rib contacting the lower surface of the first printed circuit board is disposed on an upper surface of the lower plate,
wherein at least a part of the lower surface of the top plate is spaced apart from the upper surface of the first printed circuit board by a predetermined distance through the first rib, and
wherein at least a part of the upper surface of the lower plate is spaced apart from the lower surface of the first printed circuit board by a predetermined distance through the second rib.

* * * * *